(12) United States Patent
Chaisemartin

(10) Patent No.: US 6,236,228 B1
(45) Date of Patent: May 22, 2001

(54) STRUCTURE AND METHOD OF REPAIR OF INTEGRATED CIRCUITS

(75) Inventor: Philippe Chaisemartin, Saint Agnes (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/152,778

(22) Filed: Sep. 14, 1998

(30) Foreign Application Priority Data

Sep. 25, 1997 (FR) .................................................. 97 12168

(51) Int. Cl.[7] .............................. H01L 25/00; H03K 19/00
(52) U.S. Cl. ............................. 326/10; 326/101; 257/211; 716/16; 716/17
(58) Field of Search ..................... 326/10, 101, 102–103, 326/41, 47; 716/1, 8–18; 257/209, 211

(56) References Cited

U.S. PATENT DOCUMENTS

| | | | |
|---|---|---|---|
| 5,459,342 | * 10/1995 | Nogami et al. | 257/209 |
| 5,512,397 | 4/1996 | Leedy | 430/30 |
| 5,633,806 | * 5/1997 | Yusa et al. | 716/16 |
| 5,679,967 | * 10/1997 | Janai et al. | 257/209 |
| 5,777,887 | * 7/1998 | Marple et al. | 716/16 |
| 5,892,249 | * 4/1999 | Courtright et al. | 257/211 |

FOREIGN PATENT DOCUMENTS 0 774 780   5/1997   (EP) .............................. H01L/21/66

* cited by examiner

*Primary Examiner*—Jon Santamauro
(74) *Attorney, Agent, or Firm*—Wolf, Greenfield & Sacks, P.C.; James H. Morris; Theodore E. Galanthay

(57) ABSTRACT

The present invention relates to an integrated circuit, at least one portion of which includes at least one group of standby cells for possible connection to said portion of the integrated circuit by replacement connections, the length of which cannot exceed a predetermined value. The inputs and outputs of the standby cells are connected to metal standby tracks being disposed on the circuit such that any node of the circuit portion is distant by at most said predetermined value from any point on the tracks.

11 Claims, 7 Drawing Sheets

STRUCTURE AND METHOD OF REPAIR OF INTEGRATED CIRCUITS

BACKGROUND OF THE INVENTION

1. Field of the Invention

The present invention relates to the field of integrated circuits.

2. Discussion of the Related Art

The fast development of technology has led to an increase in circuit complexity at the same time as a decrease in the commercial lifetime of circuits. Conversely, the time required by a manufacturing cycle (mask patterning, processing of the silicon wafers, circuit testing and encapsulating) remains significant.

Inevitably, after designing a complex integrated circuit, the first manufactured circuits frequently exhibit errors. The circuit can then be run back through the design steps to attempt to correct the error, prior to starting again a manufacturing batch. This requires a new thorough cycle of manufacturing, which is costly and long and can put the commercial interest of the circuit at risk.

It is thus often preferred to correct the hardware element formed by the integrated circuit itself. This, with the purpose of validating the correction on a few prototypes only. The correction on circuits produced in series can only be done by modifying the masks. An integrated circuit generally includes a semiconductor substrate currently made of silicon in which the several primary circuit components are formed. This substrate is topped by several levels of conductive layers (polysilicon, metallizations, generally called "metallization levels"). Once a defect has been identified in the integrated circuit, such as a missing logic function, high precision machines (MDL 1000 of Bertin/Spectra Physics for the laser cut, FIB (Focus Ion Beam) of Schlumberger for the cut and the perforation, the metal deposition and the oxide deposition) are used to perforate the metallization levels to obtain access to the terminals of the primary components, to disconnect these components and to connect back the inputs and the outputs of these components to a "standby cell" in order to add the missing logic function.

Standby cells have no function in the circuit as long as this circuit does not require correction, and their inputs are conventionally grounded to avoid useless power consumption. Standby cells are conventionally implanted by groups. FIG. 1A schematically shows a conventional group 11 of standby cells formed of a NAND gate (1), of a D flip-flop (2) and of a tri-state gate (3) that enable a great variety of corrections.

FIG. 1B shows as an example a very simplified top view of an integrated circuit, the basic components of which have not been shown. In this integrated circuit 10, a great number of groups of standby cells 11 is implanted. These cells, in a repair, are to be connected to selected circuit nodes. These cells must be very numerous since a limitation of the above-mentioned correction method is that machines for establishing the replacement connections (conventionally by implantation of metal at the circuit surface) do not allow, for technical reasons, replacement connections to exceed a given length ($\Delta$). For a circuit to be possibly repaired at each of its nodes, each of its nodes must not be further than length $\Delta$ from a group of standby cells. Thus, standby cell groups 11 are conventionally arranged according to rows and columns distant by $2\Delta/\sqrt{2}$ from one another across the entire circuit 10 that is desired to be made repairable. Also, the groups of cells can be at a distance of $\Delta/\sqrt{2}$ from the edges of the circuit that is desired to be made repairable. The standby cells, implanted among the basic circuit components, occupy a surface which is far from being negligible and increase the circuit surface, and thereby its cost.

Taking as an example a circuit such as shown in FIG. 1B, of 10 mm×10 mm, $\Delta$ being equal to 400 $\mu$m, the number of implanted standby cell groups will be $(10,000 \times \sqrt{2}/400) \times (10,000 \times \sqrt{2}/400) = 10,000/8 = 1,250$. Assuming that a group of standby cells is formed of approximately forty transistors, the groups of standby cells in this embodiment according to prior art altogether amount to $1,250 \times 40 = 50,000$ transistors. A chip of 10 mm×10 mm conventionally amounts to one million transistors, and the standby cells represent in this case 5% of the chip surface, which will increase the chip price by at least 5%.

To maintain reasonable prices, there is a temptation to reduce the number of standby cell groups, and to place them only in the circuit areas which are the most likely to exhibit errors, but the insurance of being able to perform a repair at any node of the circuit is thereby lost, and problems of impossible repairs sometimes arise.

Another limitation of this method is associated with the fact that the cutting or the establishing of a connection leads to digging the upper surfaces of the circuit to the connection to be cut, and to the terminals of the standby cell which is desired to be connected. The deeper the elements to be reached, the more the subsequent digging operation and connection operation will be delicate, long and costly.

SUMMARY OF THE INVENTION

An object of the present invention is to overcome the disadvantages of the above-mentioned correction methods.

A more specific object of the present invention is to reduce the silicon surface occupied by the standby cells.

Another object of the present invention is to facilitate repair operations by reducing metallization layer crossing operations.

These objects as well as others are achieved by an integrated circuit including at least one group of standby cells connected to metal tracks arranged on the circuit so that any node of the circuit is distant from these tracks by at most the maximum value $\Delta$ allowed for an emergency repair. So connected, a single group of standby cells is sufficient to guarantee that at least one repair can be performed at any node of the circuit.

According to an embodiment of the present invention, the standby tracks are made in a single metal level as close as possible to the circuit surface, to facilitate a possible repair.

More specifically, the present invention provides an integrated circuit, at least one portion of which includes at least one group of standby cells for possible connection to said portion of the integrated circuit after manufacturing thereof by replacement connections, the length of which cannot exceed a predetermined value, and in which the inputs and outputs of the standby cells are connected to metal standby tracks being disposed on the circuit such that any node of the circuit portion is distant by at most said predetermined value from any point the tracks.

According to an embodiment of the present invention, the circuit includes several metallization levels, and the standby tracks are mostly made in the highest possible metallization level.

According to an embodiment of the present invention, the inputs of a first group of standby cells are connected to a ground of the circuit and other groups of standby cells are connected in series with the first group by standby tracks arranged side by side in groups of standby tracks, so that no input of a standby cell is floating.

According to an embodiment of the present invention, the groups of standby cells are implanted substantially regularly along the groups of standby tracks.

According to an embodiment of the present invention, the groups of standby tracks are arranged in a zigzag pattern on the circuit portion in a succession of lines of same direction, extending across the entire width of the circuit portion, these lines being interconnected at each end by a portion of perpendicular column substantially equal to twice the predetermined value of a replacement connection.

According to an embodiment of the present invention, a group of standby cells is arranged substantially at one end of each line of a group of standby tracks.

According to an embodiment of the present invention, the inputs of the first group of standby cells are connected to the circuit ground by small segments of standby tracks.

According to an embodiment of the present invention, the outputs of a standby cell unconnected to a following standby cell are connected to small segments of standby tracks which have been left floating.

According to an embodiment of the present invention, a group of standby cells includes standard elements such as a NAND gate, a D flip-flop, and a tri-state gate.

The present invention also relates to a method comprising implanting in a portion of an integrated circuit at least one group of standby cells meant to be possibly connected to nodes of said integrated circuit portion after the manufacturing thereof by replacement connections, the length of which cannot exceed a predetermined value, and of connecting the inputs and outputs of the standby cells to metal tracks called standby tracks, being disposed on the circuit such that any node of said circuit portion is distant by at most said predetermined value from any point on these tracks, the standby tracks being made in the highest possible metallization level.

The foregoing objects, features and advantages of the present invention will be discussed in detail in the following non-limiting description of specific embodiments made in connection with the accompanying drawings.

DETAILED DESCRIPTION

Figure 1A:
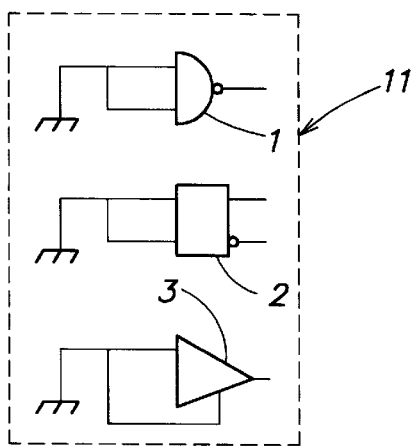
FIG. 1A shows a group of standby cells according to the state of the art.
Figure 1B:
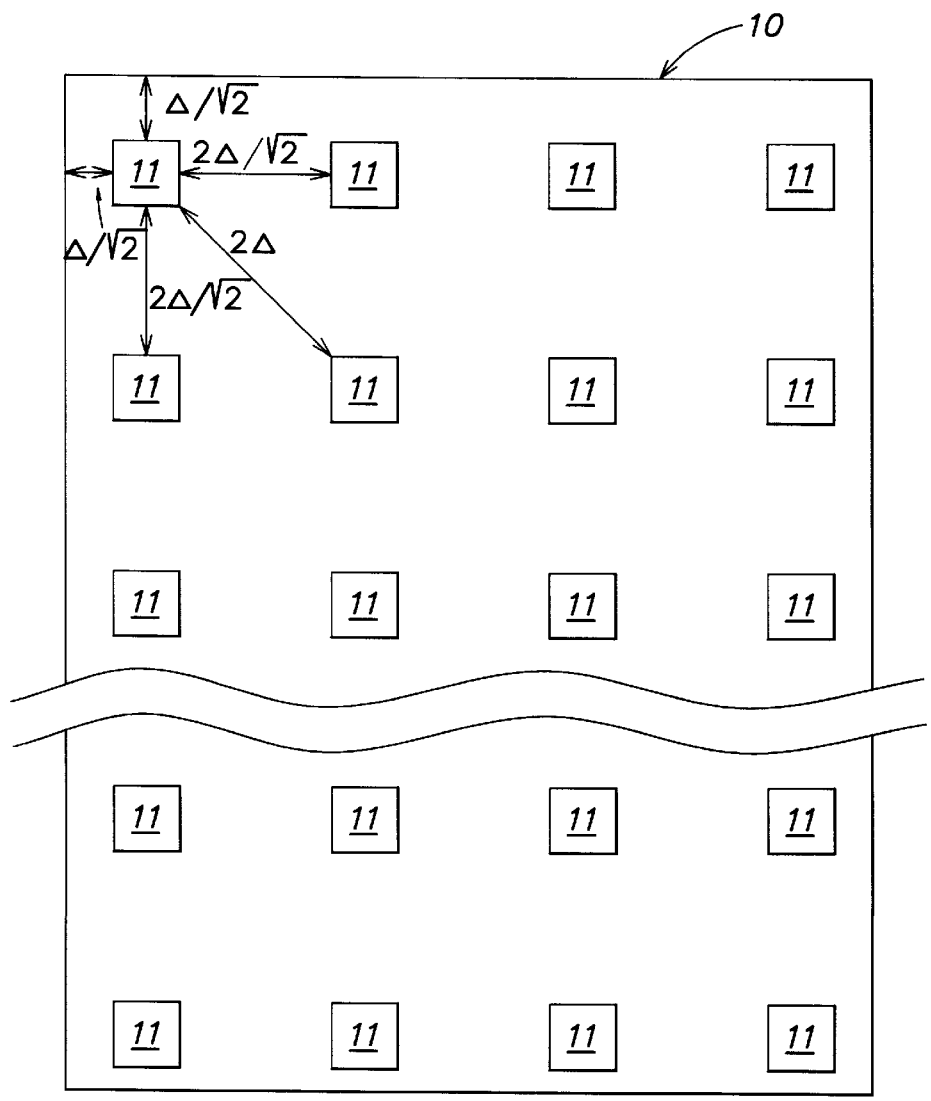
FIG. 1B shows a circuit which has been made repairable at any node according to the state of the art and describes the problem that the present invention aims at solving.
Figure 2A:
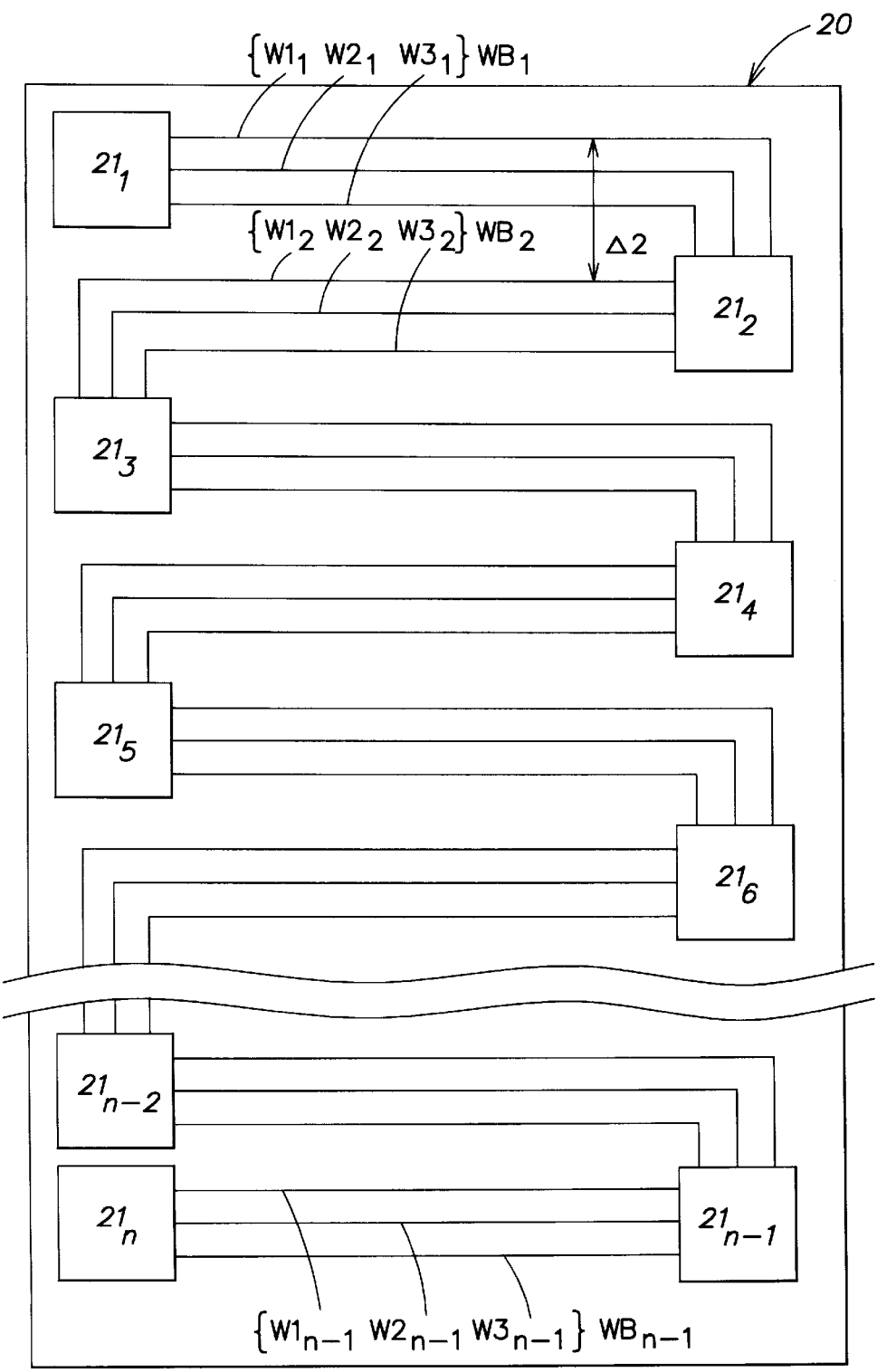
FIG. 2A shows a circuit which has been made repairable at any node according to an embodiment of the present invention.

FIG. 2A shows a very simplified top view of an integrated circuit 20, the basic components of which have not been shown, which can be repaired at any node according to the present invention. This circuit includes groups of standby cells $21_1$ to $21_n$, interconnected by groups of "standby tracks" $WB_1$ to $WB_{n-1}$. Each group of standby tracks $WB_i$, i being included between 1 and n−1, is formed of a given number of elementary tracks, 3 in this example, designated as $W1_i$, $W2_i$, and $W3_i$. The groups of tracks are arranged in a zigzag pattern on the circuit portion in such a way that the distance between any node of the circuit portion and the closest standby tracks is at most equal to the maximum distance ($\Delta$) allowed for a repair. The "branches" of the zigzag pattern are distant by $2\Delta$ from each other. The embodiment of FIG. 2A includes one group of standby cells per branch of the zigzag pattern, which can allow a repair to be performed at the level of each branch of the zigzag pattern.

Taking as an example a circuit such as shown in FIG. 2A, of 10 mm by 10 mm, $\Delta$ being equal to 400 $\mu$m, the number of groups of implanted standby cells will be 10,000/800= 12.5, that is, 13 standby groups. Assuming that a group of standby cells is formed of approximately forty transistors, the standby cell groups in this embodiment according to the present invention altogether amount to 13×40=520 transistors. A chip of 10 mm by 10 mm conventionally includes one million transistors, and the standby cells amount, in this case, to approximately 5 ten thousandths of the chip surface, which is relatively negligible.

To perform a correction between two electric terminals located in the integrated circuit, a hole is made in the upper surfaces of the circuit to each of the electric terminals which are desired to be connected. The achieved holes are filled with metal to the level of the circuit surface to enable contact with a replacement connection. The shallower a hole, the less difficult it is to bore. Further, the shallower a hole, the more the filling operation of the hole with metal is easily performed. The operations relating to the holes meant to access the terminals of the integrated circuit components are not simplified by the present invention. However, the operations relating to the holes meant to access to the standby tracks can be facilitated. The standby tracks are preferably implanted in the metallization level which is closest to the integrated circuit surface to limit the depth of the holes which will be bored to reach them. If the implantation of the standby tracks on the highest metallization level enters, in places, in conflict with the functional tracks of the circuit implanted on the same level, a local diversion, preferably of the functional track, must be provided in these places, by a lower metallization level. This type of local diversion of an integrated circuit track from a metallization level to another metallization level is known by those skilled in the art and will not be detailed in the present description.

Figure 2B:
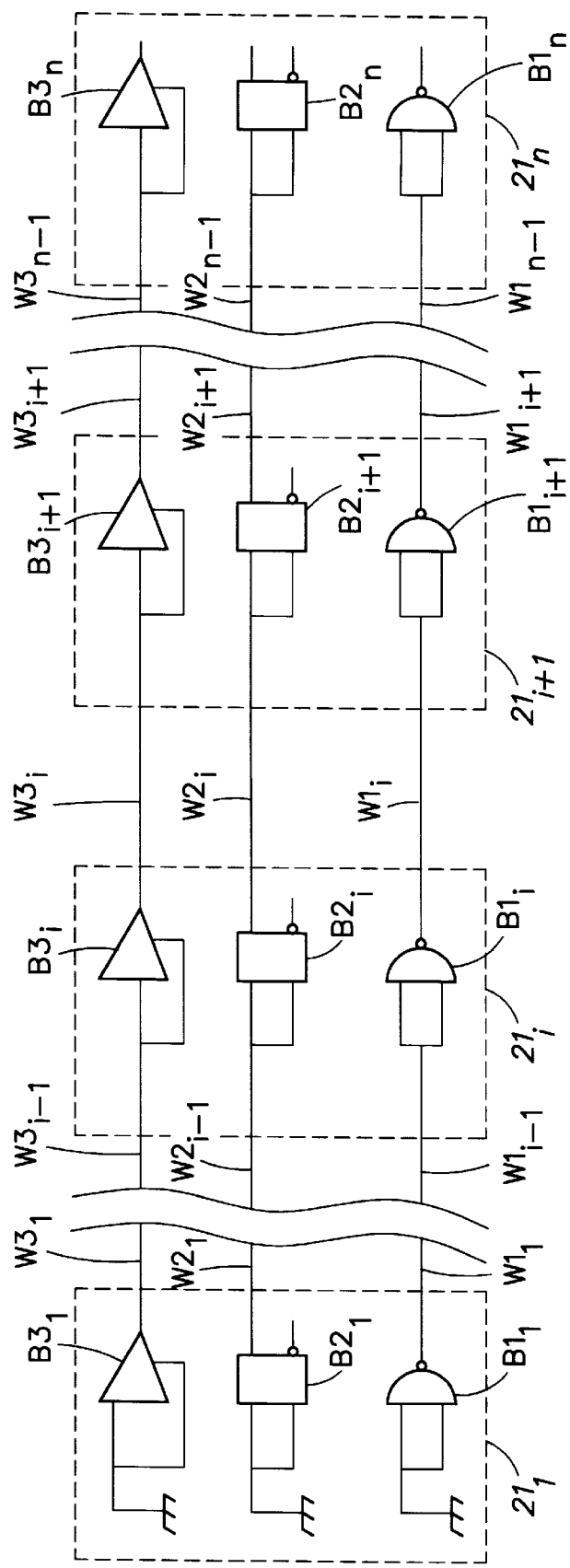
FIG. 2B shows groups of standby cells used in an embodiment of the present invention.

FIG. 2B shows groups of standby cells $21_1$ to $21_n$ useable in FIG. 2A. In an embodiment of the present invention, a group of standby cells $21_i$ is formed of a NAND gate $B1_i$, of a D flip-flop $B2_i$, and of a tri-state gate $B3_i$. To limit the power consumed by the standby cells if the latter are not used, all the inputs of the standby cells are connected to a fixed potential. The various cells of a same group of standby cells are preferably implanted side by side on the integrated circuit. The distances which separate the various cells of a same group of standby cells are in all cases much lower than above-mentioned distance $\Delta$.

According to an embodiment of the present invention, the inputs of the cells of the first group of standby cells $21_1$ are grounded by small segments of standby tracks, and the outputs of the cells of the last group of standby cells $21_n$ are connected to small segments of standby tracks which have been left floating, to facilitate their possible connection in a repair.

According to an embodiment of the present invention, the two inputs of NAND gate $B1_i$ of a group of cells $21_i$ are short-circuited and connected to the output of NAND gate $B1_{i-}1$ of the preceding group of cells $21_{i-1}$ by standby track $W1_{i-}1$. The short-circuit between the two inputs of the NAND gate is preferably performed by small standby track segments to facilitate a possible separation of the two inputs in a repair.

The two inputs of D flip-flop $B2_i$ of a group of cells $21_i$ are connected together to an output of D flip-flop $B2_{i-1}$ of the preceding group of cells $21_i\_1$ by standby track $W2_{i-}1$. The short-circuit between the two inputs of the D flip-flop is preferably implemented by small segments of standby tracks to facilitate a possible separation of the two inputs in a repair; the unconnected output of flip-flop D is preferably connected to a small standby track segment, to facilitate its connection in a repair.

The two inputs of tri-state gate $B3_i$ of a group of cells $21_i$ are short-circuited and connected to the output of tri-state gate $B3_{i-1}$ of the preceding group of cells $21_i\_1$ by standby track $W3_{i-}1$. The short-circuit between the two inputs of the tri-state gate is preferably implemented by small standby track segments to facilitate a possible separation of the two inputs in a repair.

Figure 2C:
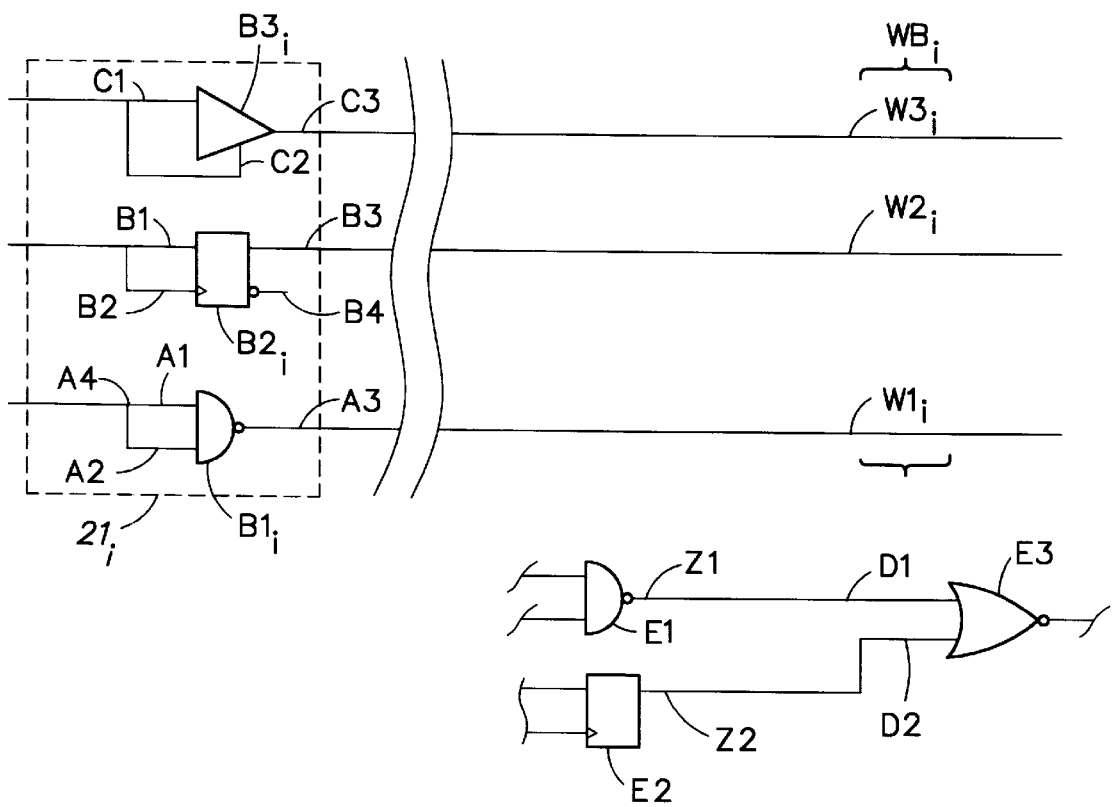
FIG. 2C shows a portion of an integrated circuit according to an embodiment of the present invention, comprising an error, before collection.

FIG. 2C very schematically shows a portion of an integrated circuit according to the present invention. It represents a group of standby cells $21_i$ (including a NAND gate $B1_i$ having two inputs A1 and A2 short-circuited at A4 and one output A3, a D flip-flop $B2_i$ having two inputs B1 and B2 and two outputs B3 and B4, and a tri-state gate $B3_i$ having two inputs C1 and C2 and one output C3), a group of standby tracks $WB_i$ (including $W1_i$ connected to A3, $W2_i$ connected to B3, and $W3_i$ connected to C3) and primary circuit components. The primary components include a NAND gate E1 having an output Z1, a D flip-flop E2 having an output Z2 and a NOR gate E3 having two inputs D1 and D2. Output Z1 is connected to input D1, output Z2 is connected to input D2. The signals on outputs Z1 and Z2 are designated hereafter by Z1 and Z2. It is assumed that the portion of integrated circuit formed of primary components E1, E2, and E3 exhibits a logic error. It is assumed that this error can be corrected by replacing on input D2 of component E3 signal Z2 with a signal corresponding to Z1 NAND Z2.

Figure 2D:
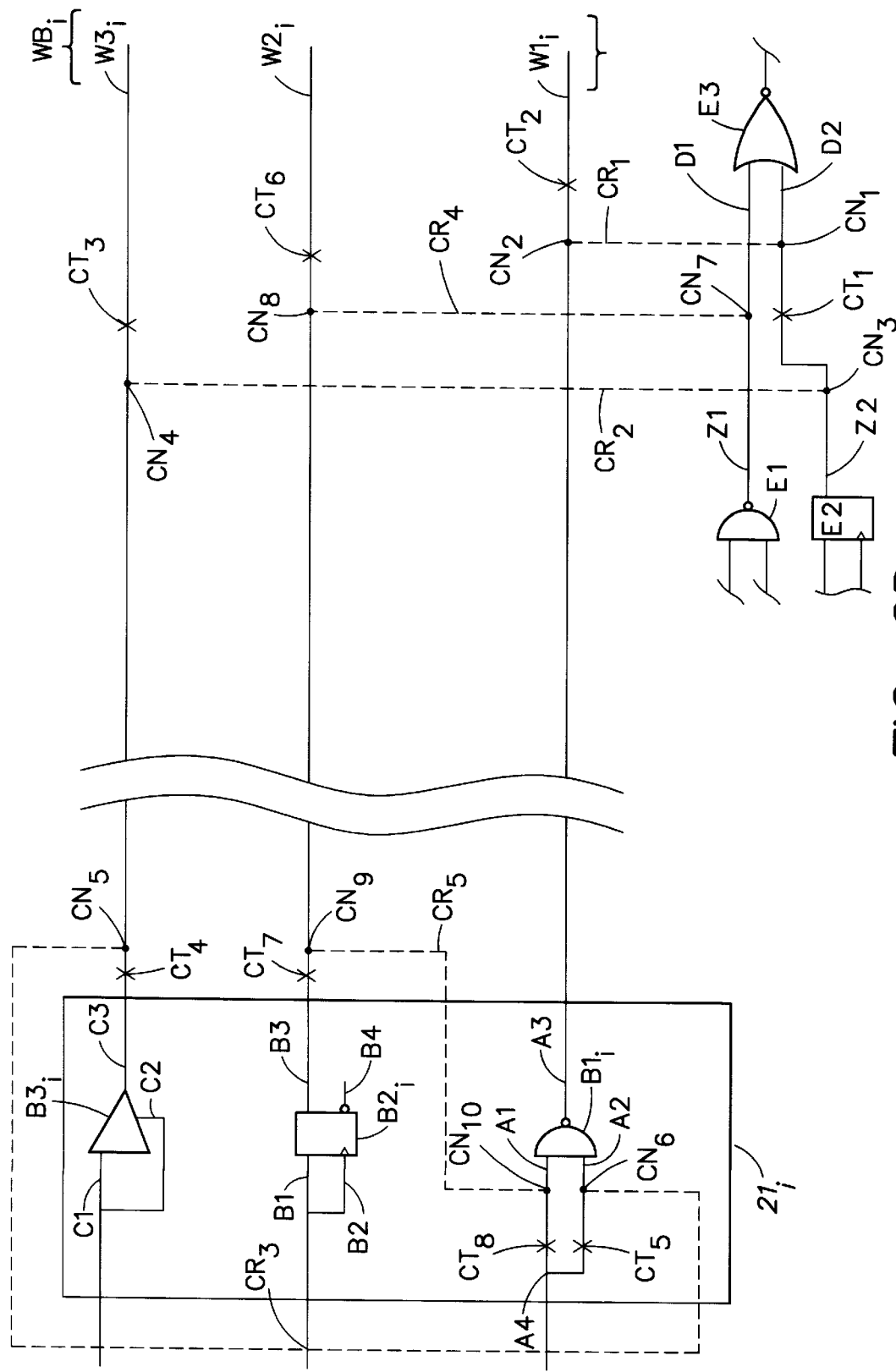
FIG. 2D shows a portion of an integrated circuit according to an embodiment of the present invention, comprising an error, after correction.

FIG. 2D shows the circuit of FIG. 2C after correction of the error.

Output A3 of NAND gate $B1_i$ has first been connected to input D2 of component E3 by using standby track $W1_i$. A track cut has been performed at a point $CT_1$ of the track connecting output Z2 to input D2. A hole has been made at a point $CN_1$ of the track located between point $CT_1$ and input D2. A hole has been made at a point $CN_2$ of $W1_i$ such that distance $CN_1$–$CN_2$ is the shortest possible. A replacement connection $CR_1$ has been established between points $CN_1$ and $CN_2$. A track cut has been performed at a point $CT_2$ of track $W1_i$ between point $CN_2$ and the next standby cell $B1_{i+1}$ (not shown, for clarity).

Output Z2 of component E2 has then been connected to input A2 of NAND gate $B1_i$ by using standby track $W3_i$. A hole has been made at a point $CN_3$ of the track located between output Z2 and point $CT_1$. A hole has been made at a point $CN_4$ of $W3_i$ such that distance $CN_3$–$CN_4$ is the shortest possible. A replacement connection $CR_2$ has been established between points $CN_3$ and $CN_4$. A cut of track $W3_i$ has been performed at a point $CT_3$ between point $CN_4$ and the next standby cell $B3_{i+}1$ (not shown, for clarity). A hole has been made at a point $CN_5$ of $W3_i$ between point $CN_4$ and output C3 of tri-state gate $B3_i$ such that point $CN_5$ is close to NAND gate $B1_i$. A track cut has been performed at a point $CT_4$ of track $W3_i$ between point $CN_5$ and output C3. A hole has been made at a point $CN_6$ of the track located between point A4 and input A2. A track cut has been performed at a point $CT_5$ of the track located between point $CN_6$ and point A4. A replacement connection $CR_3$ has been established between points $CN_5$ and $CN_6$.

Output Z1 of component E1 has then been connected to input A1 of NAND gate $B1_i$ by using standby track $W2_i$. A hole has been made at a point $CN_7$ of the track located between output Z1 and input D1. A hole has been made at a point $CN_8$ of $W2_i$ such that distance $CN_7$–$CN_8$ is the shortest possible. A replacement connection $CR_4$ has been established between points $CN_7$ and $CN_8$. A cut of track $W2_i$ has been performed at a point $CT_6$ between point $CN_8$ and the next standby cell $B2_{i+}1$ (not shown, for clarity). A hole has been made at a point $CN_9$ of $W2_i$ between point $CN_8$ and output B3 of D flip-flop $B2_i$ such that point $CN_9$ is close to NAND gate $B1_i$. A cut of track $W2_i$ has been performed at a point $CT_7$ located between point $CN_9$ and output B3. A hole has been made at a point $CN_{10}$ of the track located between point A4 and input A1. A track cut has been performed at a point $CT_8$ of the track located between point $CN_1 0$ and point A4. A replacement connection $CR_5$ has been established between points $CN_9$ and $CN_1 0$.

Input terminal D2 of component E3 receives a signal corresponding to Z1 NAND Z2 at the end of this correction.

Of course, the present invention is likely to have various alterations, modifications, and improvements which will readily occur to those skilled in the art.

Figure 2E:
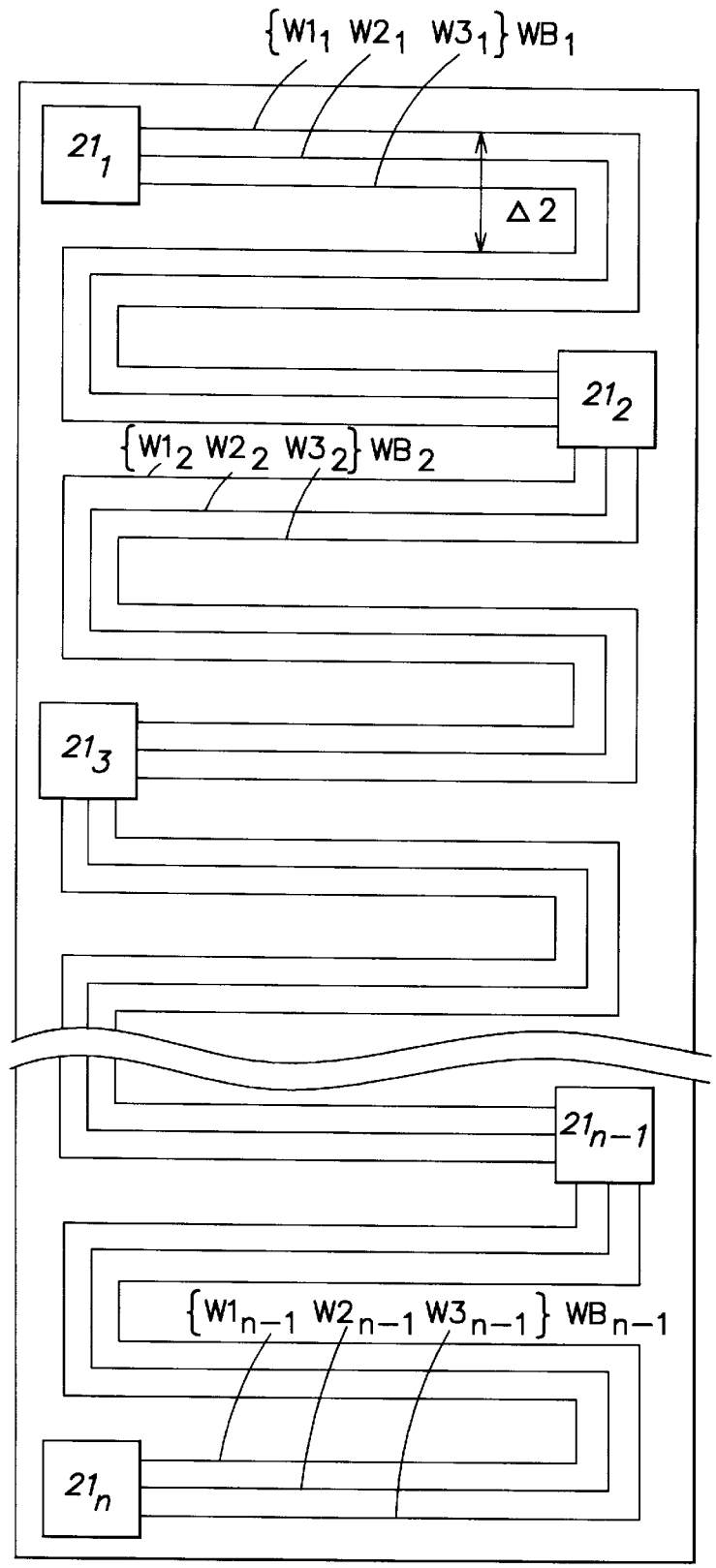
FIG. 2E illustrates another embodiment of the present invention.

FIG. 2E shows as an alternative an extremely simplified top view of an integrated circuit 20, the basic components of which have not been shown, which may be repaired at any node according to the present invention, including groups of standby cells $21_1$ to $21_n$ interconnected by groups of standby tracks $WB_1$ to $WB_{n-}1$. Each group of standby tracks $WB_i$, i being included between 1 and n–1, is formed of a given number of elementary tracks, 3 in this example, designated by $W1_i$, $W2_i$, and $W3_i$. The groups of tracks are arranged in zigzag on the circuit portion so that the distance between any node of the circuit portion and the closest standby tracks is at most equal to the maximum distance (Δ) allowed for a repair. The branches of the zigzag pattern are distant of 2Δ from one another. A group of standby cells $21_i$ is connected to a group of standby tracks $WB_i$ corresponding to three zigzag branches. This alternative allows a smaller number of repairs to be performed on circuit 20 than with the embodiment of FIG. 2A. However, since there are less standby cells, the surface added to the circuit by the standby cells will be reduced with respect to the alternative of FIG. 2A.

Figure 2F:
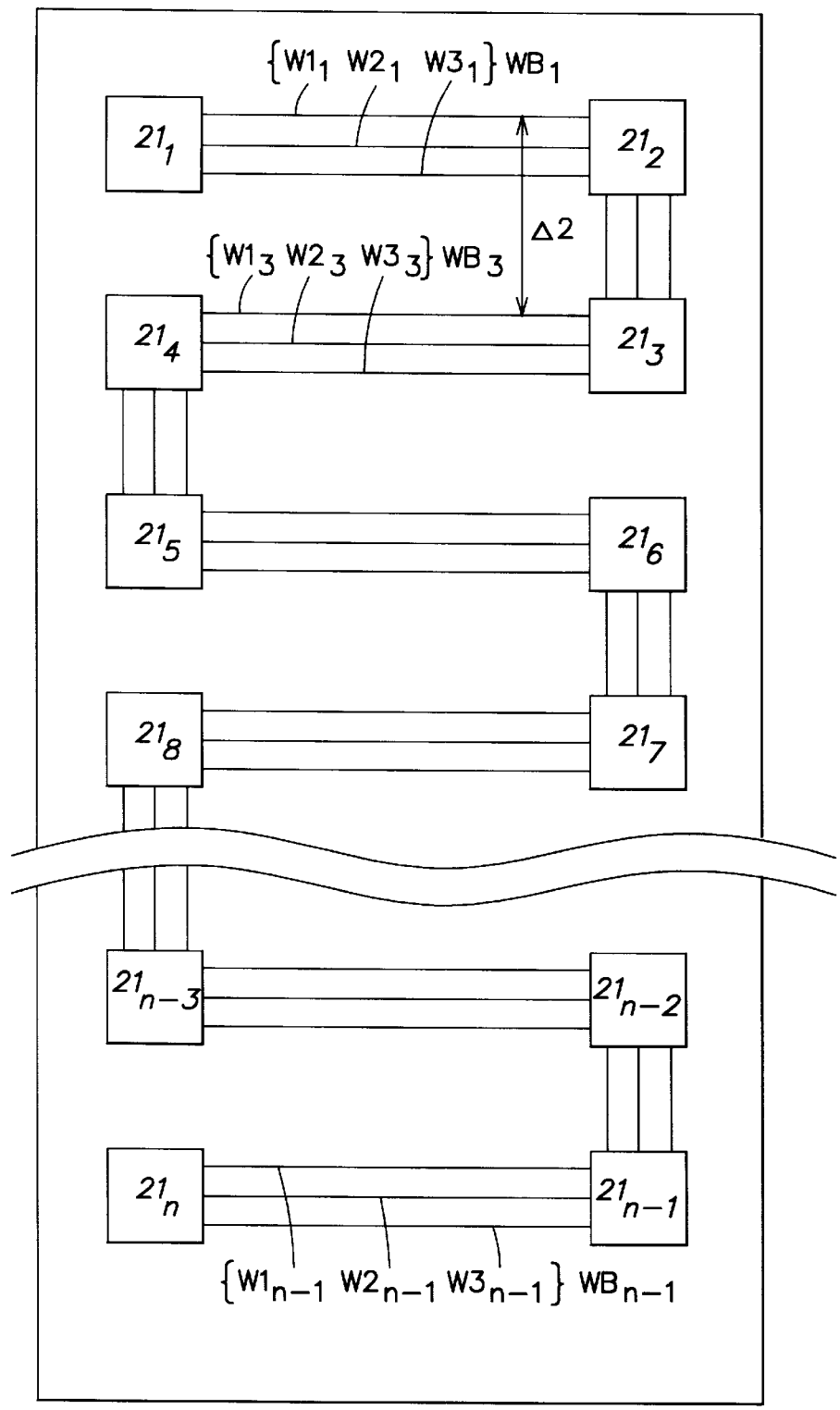
FIG. 2F illustrates another embodiment of the present invention.

FIG. 2F shows as an alternative an extremely simplified top view of an integrated circuit 20, the base components of which have not been shown, which may be repaired at any node according to the present invention, including groups of standby cells $21_1$ to $21_n$ interconnected by groups of standby tracks $WB_1$ to $WB_{n-}1$. Each group of standby tracks $WB_i$, i being included between 1 and n–1, is formed of a given number of elementary tracks, 3 in this example, designated by $W1_i$, $W2_i$, and $W3_i$. The groups of tracks are arranged in a zigzag pattern on the circuit portion so that the distance between any node of the circuit portion and the closest standby tracks is at most equal to the maximum distance ($\Delta$) allowed for a repair. The branches of the zigzag are distant of $2\Delta$ from one another. Two groups of standby cells $21_i$, $21_{i+1}$ are connected at each end of a group of standby tracks $WB_i$ corresponding to a zigzag branch. Since the number of standby cells is doubled with respect to the alternative of FIG. 2A, the surface added to the circuit by the standby cells will be doubled. However, this alternative allows performance of a greater number of repairs on circuit 20 than with the embodiment of FIG. 2A.

As an alternative, a group of standby cells can use a greater number, or other standard cells than the above-described NAND gate, D flip-flop, and tri-state gate, or use a greater number of standby tracks.

As a further alternative, the distribution of the standby tracks on the circuit surface can be different from a zigzag pattern and could, for example, be in the shape of a spiral.

Up to now, the case of standby tracks covering an entire integrated circuit has been described, but some portions of an integrated circuit, such as, for example, matrices of memory devices or microprocessor cores, are not adapted to this type of correction and are very unlikely to exhibit errors. Those skilled in the art can adapt the above description to the sole portions of an integrated circuit likely to exhibit errors and to be repaired.

Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalent thereto.

What is claimed is:

1. An integrated circuit, at least one portion of which includes at least one group of standby cells connectable to said portion of the integrated circuit after manufacturing thereof by replacement connections, a length of which cannot exceed a predetermined value, wherein inputs and outputs of the standby cells are connected to metal standby tracks being disposed on the circuit such that any node of the circuit portion is distant by at most said predetermined value from any point on the tracks, wherein the inputs of a first group of standby cells are connected to a ground of the circuit and wherein other groups of standby cells are connected in series with the first group by standby tracks arranged side by side in groups of standby tracks, so that no input of a standby cell is floating.

2. The integrated circuit of claim 1, including several metallization levels, wherein the standby tracks are mostly made in the highest possible metallization level.

3. The integrated circuit of claim 1, wherein the groups of standby cells are implanted substantially regularly along the groups of standby tracks.

4. The integrated circuit of claim 1, wherein the inputs of the first group of standby cells are connected to the circuit ground by small segments of standby tracks.

5. The integrated circuit of claim 1, wherein the outputs of a standby cell unconnected to a following standby cell are connected to small segments of standby tracks left floating.

6. The integrated circuit of claim 1, wherein a group of standby cells includes standard elements.

7. The integrated circuit of claim 1, wherein the standard elements comprise one of a NAND gate, a D flip-flop, and a tri-state gate.

8. An integrated circuit, at least one portion of which includes at least one group of standby cells connectable to said portion of the integrated circuit after manufacturing thereof by replacement connections, a length of which cannot exceed a predetermined value, wherein inputs and outputs of the standby cells are connected to metal standby tracks being disposed on the circuit such that any node of the circuit portion is distant by at most said predetermined value from any point on the tracks, wherein the groups of standby tracks are arranged in a zigzag pattern on the circuit portion in a succession of lines of same direction, extending across an entire width of the circuit portion, these lines being interconnected at each end by a portion of perpendicular column substantially equal to twice the predetermined value of a replacement connection.

9. The integrated circuit of claim 8, wherein a group of standby cells is arranged substantially at one end of each line of a group of standby tracks.

10. The integrated circuit of claim 8, wherein a group of standby cells includes standard elements.

11. The integrated circuit of claim 10, wherein the standard elements comprise one of a NAND gate, a D flip-flop, and a tri-state gate.

* * * * *